(12) United States Patent
Kihara

(10) Patent No.: US 11,417,165 B2
(45) Date of Patent: Aug. 16, 2022

(54) VENDING MACHINE INTERFACE AND PRESSURE SENSOR

(71) Applicant: Murata Manufacturing Co., Ltd., Nagaokakyo (JP)

(72) Inventor: Takashi Kihara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 233 days.

(21) Appl. No.: 16/171,812

(22) Filed: Oct. 26, 2018

(65) Prior Publication Data
US 2019/0066430 A1 Feb. 28, 2019

Related U.S. Application Data

(63) Continuation of application No. PCT/JP2017/026754, filed on Jul. 25, 2017.

(30) Foreign Application Priority Data

Aug. 2, 2016 (JP) .............................. JP2016-151888

(51) Int. Cl.
*G07F 17/00* (2006.01)
*G06F 3/041* (2006.01)
(Continued)

(52) U.S. Cl.
CPC .......... *G07F 17/0014* (2013.01); *G06F 3/041* (2013.01); *G06F 3/04842* (2013.01);
(Continued)

(58) Field of Classification Search
CPC ........ G07F 17/0014; G07F 9/02; G07F 9/026; G06F 3/041; G06F 3/04842;
(Continued)

(56) References Cited

U.S. PATENT DOCUMENTS 4,354,613 A * 10/1982 Desai .................... G07F 5/24
194/217
4,377,049 A 3/1983 Simon et al.
(Continued)

FOREIGN PATENT DOCUMENTS

| CN | 102687222 A | 9/2012 |
| CN | 203503053 U | 4/2014 |

(Continued)

OTHER PUBLICATIONS

International Search Report issued for PCT/JP2017/026754, dated Oct. 24, 2017.
(Continued)

*Primary Examiner* — Peter Ludwig
*Assistant Examiner* — Reva R Moore
(74) *Attorney, Agent, or Firm* — ArentFox Schiff LLP

(57) ABSTRACT

A vending machine interface includes a front panel, a product selection panel, and a piezoelectric element. The front panel bends in a normal direction when being pushed by a user. The product selection panel is disposed facing the front panel. A detection element is attached to the product selection panel and configured to detect bending of the front panel.

28 Claims, 10 Drawing Sheets

(51) Int. Cl.
*G06F 3/04842* (2022.01)
*G07F 9/02* (2006.01)
*H01L 41/193* (2006.01)
*H01L 41/113* (2006.01)
*H01H 13/00* (2006.01)
*H01H 13/704* (2006.01)
*H02N 2/00* (2006.01)
*H02N 2/18* (2006.01)
*G01L 1/16* (2006.01)

(52) U.S. Cl.
CPC ............... *G07F 9/02* (2013.01); *G07F 9/026* (2013.01); *H01H 13/00* (2013.01); *H01H 13/704* (2013.01); *H01L 41/1132* (2013.01); *H01L 41/193* (2013.01); *H02N 2/0055* (2013.01); *H02N 2/18* (2013.01); *G01L 1/16* (2013.01); *G06F 2203/04102* (2013.01); *G06F 2203/04103* (2013.01)

(58) Field of Classification Search
CPC ............ G06F 2203/04102; G06F 2203/04103; H01H 13/00; H01H 13/704; H01L 41/1132; H01L 41/193; H02N 2/0055; H02N 2/18; G01L 1/16; H03K 17/9625; H03K 17/9643
USPC ....................... 705/17, 20; 235/380; 700/236; 221/197, 133
See application file for complete search history.

(56) References Cited

U.S. PATENT DOCUMENTS

| | | | | | |
|---|---|---|---|---|---|
| 4,554,419 | A | * | 11/1985 | King | G07F 9/02 200/317 |
| 4,598,379 | A | * | 7/1986 | Awane | G07F 9/026 700/232 |
| 5,022,172 | A | * | 6/1991 | Kawahara | G09F 11/025 40/503 |
| 5,255,968 | A | * | 10/1993 | Craven | G07F 9/02 312/234 |
| 5,303,844 | A | * | 4/1994 | Muehlberger | G07F 7/069 221/1 |
| 2005/0167440 | A1 | * | 8/2005 | Huffer | G07F 11/28 221/92 |
| 2006/0289553 | A1 | * | 12/2006 | Ehlers | G07F 9/026 221/9 |
| 2009/0228142 | A1 | * | 9/2009 | Levasseur | G07F 9/02 700/232 |
| 2010/0070075 | A1 | * | 3/2010 | Chirnomas | G07F 9/02 700/242 |
| 2010/0253552 | A1 | | 10/2010 | Lanceros et al. | |
| 2012/0004771 | A1 | * | 1/2012 | Walker | G07F 11/36 221/124 |
| 2012/0065775 | A1 | | 3/2012 | Ward et al. | |
| 2012/0268379 | A1 | | 10/2012 | Yoshioka | |
| 2012/0310409 | A1 | * | 12/2012 | Breitenbach | G06Q 10/087 700/237 |
| 2014/0183211 | A1 | * | 7/2014 | Mockus | G07F 9/026 221/133 |
| 2014/0375602 | A1 | | 12/2014 | Fujiune | |
| 2015/0227173 | A1 | * | 8/2015 | Hwang | G06F 1/1652 345/619 |
| 2017/0329166 | A1 | * | 11/2017 | Akkashian | C03C 17/3618 |

FOREIGN PATENT DOCUMENTS

| | | |
|---|---|---|
| CN | 204442333 U | 7/2015 |
| JP | H02037489 A | 2/1990 |
| JP | H02306286 A | 12/1990 |
| JP | H06162332 A | 6/1994 |
| JP | 2000276637 A | 10/2000 |
| KR | 100689393 B1 | 3/2007 |

OTHER PUBLICATIONS

Written Opinion of the International Searching Authority issued for PCT/JP2017/026754, dated Oct. 24, 2017.

* cited by examiner

VENDING MACHINE INTERFACE AND PRESSURE SENSOR

CROSS REFERENCE TO RELATED APPLICATIONS

The present application is a continuation of International application No., filed Jul. 25, 2017, which claims priority to Japanese Patent Application No. 2016-151888, filed Aug. 2, 2016, the entire contents of each of which are incorporated herein by reference.

TECHNICAL FIELD

The present invention relates to a vending machine interface and a pressure sensor for use in the vending machine interface.

BACKGROUND ART

Vending machines typically include a separate selection button for each product that the vending machine dispenses so as to allow a user to make a selection from among a plurality of displayed products. For example, Japanese Patent Application Laid-Open No. H06-162332 (Patent Document 1) describes an arrangement of such selection buttons.

The structure described in Patent Document 1 includes a plurality of through holes penetrating a front panel of the vending machine. A respective selection button is disposed in each of the through holes. However, in recent years, there has been a demand for a vending machine including a front panel that does not have any such though holes.

In view of the above, an object of the present invention is to provide a vending machine interface capable of detecting a user's product selection when the front panel of the vending machine does not have through hole or selection buttons extending there through, and instead uses a pressure sensor as the vending machine interface.

BRIEF SUMMARY OF THE INVENTION

In accordance with one aspect of the invention, vending machine interface comprises:
a planar front panel that bends in a direction perpendicular to its plane in response to a pushing force applied by a user;
a product selection panel facing the front panel, the product selection panel being divided into a plurality of product selection areas, each of the product selection areas corresponding to a respective product to be vended; and
a sensor attached to the product selection panel and configured to detect when the front panel has been bent at a location corresponding to any one of the product selection areas.

In some embodiments, the vending machine interface includes a plurality of individual pressure sensors and a detector coupled to the individual pressure sensors, the detector determining to which of the product selection areas a bending force of a predetermined minimum value is being applied. The individual pressure sensors can be, for example, piezoelectric sensors of strain gauges.

In a preferred embodiment, the product selection panel is spaced from the front panel.

In a preferred embodiment, a plurality of slits and/or grooves formed in the product selection panel. Each of the slits or grooves is formed in a respective one of the product selection areas.

In another preferred embodiment, a plurality of protrusions are provided. Each of the protrusions is associated with a respective one of the product selection areas and is located on either its associated product selection area or a portion of the front panel facing its associated product selection area. Each of the protrusions extends into a space between the product selection panel and the front panel.

In another aspect of the invention, a vending machine comprises:
a planar front panel that bends in a direction perpendicular to its plane in response to a pushing force applied by a user;
a product selection panel having a first surface for holding a plurality of product samples and a second surface facing the front panel, the first surface being divided into a plurality of product placement locations, each product placement location corresponding to a respect product sample, the second surface being divided into a plurality of product selection areas, each product selection area corresponding to a respective product sample; and
a plurality of pressure sensors, each pressure sensor being attached to and associated with a respective product selection area of the product selection panel, each sensor being configured to detect bending of its associated product selection area.

The pressure sensors can be, for example, piezoelectric elements and/or strain gauges.

In a preferred embodiment, the product selection panel is spaced from the front panel.

In another preferred embodiment, a plurality of slits and/or grooves are located in the product selection panel. Each of the slits or grooves is formed in or adjacent to a respective one of the product selection areas.

In a preferred embodiment, a plurality of protrusions are provided. Each of the protrusions is associated with a respective one of the product selection areas and is located on either its associated product selection area or a portion of the front panel facing its associated product selection area. Each of the protrusions extending into a space between the product selection panel and the front panel.

In a preferred embodiment, a plurality of partition plates are provided. Each of the partition plates is connected to a back surface of the product selection panel at a respective location between a respective pair of product sample areas.

In a preferred embodiment, the first and second faces of the product selection panel are perpendicular to one another and the vending machine further includes a plurality of slits and/or grooves formed in the product selection panel. Each of the slits or grooves is associated with a respective one of the product selection areas and is located in or adjacent to its associated product selection area. Each of the slits or grooves extending in a direction parallel to the first surface.

In another aspect of the invention vending machine comprises:
a planar front panel that bends in a direction perpendicular to its plane in response to a pushing force applied by a user;
a product selection panel having a first surface for holding a plurality of product samples and a second surface facing the front panel, the first surface being divided into a plurality of product placement locations, each product placement location corresponding to a respect product sample, the second surface being divided into a plurality of product selection areas, each product selection area corresponding to a respective product sample, at least three of the product selection areas being adjacent to one another and defining a product selection area group; and
first and second pressure sensors located on opposite lateral sides of the product selection area group, each pressure sensor detecting a bending of the product selection panel in response to a pressing of the front panel in an area of one of the product selection areas of the product selection group and generating a pressure signal as a function thereof;

a detector which determines which of the product selection areas in the product selection area group has been pressed as a function of the pressure signals generated by the first and second pressure sensors.

The present invention allows a user's selection operation for each product to be detected with the need for a through hole nor a selection button provided to the front panel.

DETAILED DESCRIPTION OF THE PREFERRED EMBODIMENTS

Figure 1:
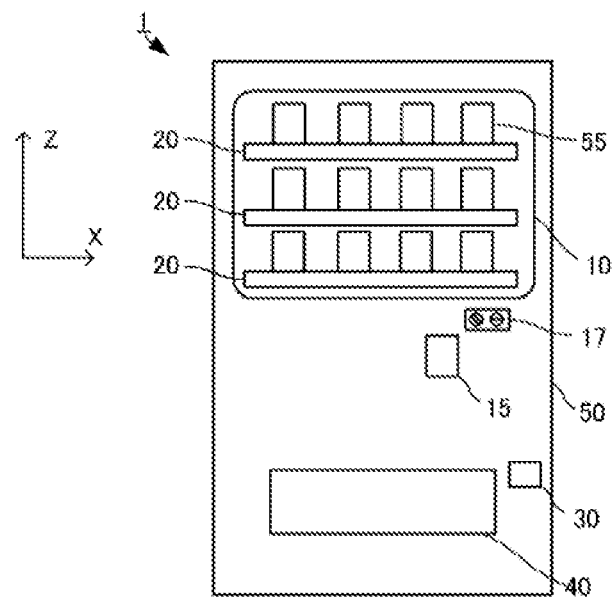
FIG. 1 is an external view of a vending machine.

Referring now to the drawings wherein like numerals indicate like elements, there is shown in FIGS. 1-5 a first embodiment of a vending machine 1 in accordance with a preferred embodiment of the invention. Vending machine 1 includes a housing 50 having a rectangular parallelepiped shape, a transparent front panel 10, a change dispenser 30, a product dispenser 40, a bill acceptor 15, and a coin acceptor 17.

The front panel 10 is preferably located on an upper side (a Z direction side) of the front of the housing 50 and covers a cavity formed in the housing 50 and holding a plurality of product samples 55. A plurality of product selection panels are also contained in the cavity. Each product selection panel is preferably associated with respective product sample 55 and is preferably located below its respective product sample. The product samples and the product selection panels can be viewed through the transparent front panel.

The front panel 10 preferably has a planar rectangular shape in front view and is preferably fixed to the housing 50 at at least four corners of the front panel 10. The front panel 10 is designed to bend in a direction normal to the plane of the front panel (i.e., into the paper as viewed in FIG. 1) when a user pushes the front surface of the front panel 10.

Figure 2:
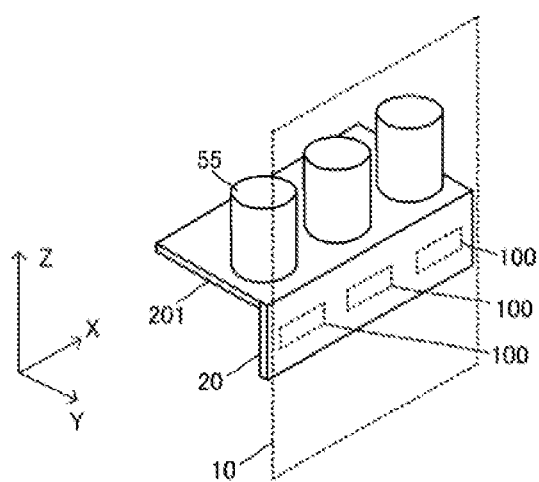
FIG. 2 is a partially-transparent perspective view of the vending machine.

As shown in FIG. 2, the product samples 55 are preferably placed on and fixed to one or more flat plates 201 which are fixed to the housing. Each flat plate 201 has opposed principal surfaces lying parallel to an XY plane (see the coordinate system shown in the drawings).

Figure 12:
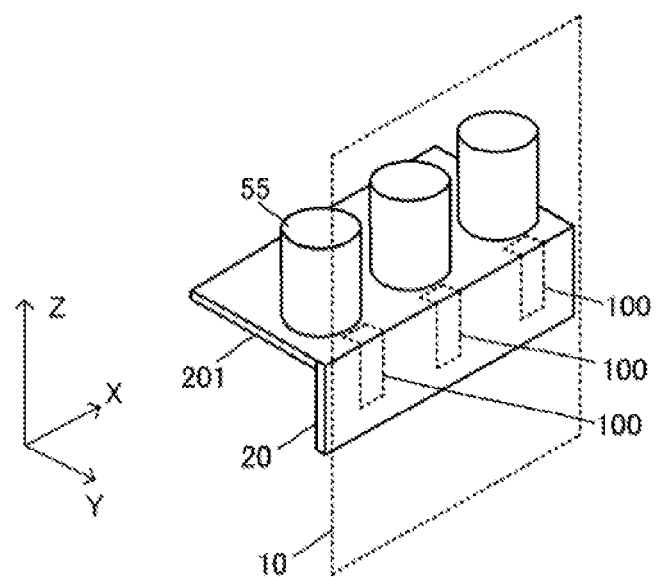
FIG. 12 is a partially-transparent perspective view of a vending machine.

One or more product selection panels 20 are coupled to the one or more flat plate(s) 20 at a front side (a Y direction side) thereof and are disposed perpendicular to the flat plate 201 to which it is coupled with a principal surface lying parallel to the XZ plane. A plurality of piezoelectric elements 100 are attached to a principal surface on a back side (a -Y direction side) of each of the product selection panels 20. Alternatively, the piezoelectric elements 100 may be attached to a front side (the Y direction side) of the product selection panel 20. Further, as shown in FIG. 12, the piezoelectric element 100 may have a bent shape so as to be attached extending across the product selection panel 20 and the flat plate 201. Furthermore, the product selection panel 20 need not necessarily be perpendicular to the flat plate 201 and may have a partially curved or chamfered structure as long as the product selection panel 20 has a portion that face the front panel. Other variations are also acceptable.

Note that the use of the flat plates 201 is not essential. For example, the product samples may be hung while being held from the back side of the product sample. In such a configuration, the product selection panel 20 can, for example, be fixed to the housing 50 at opposite ends of the product selection panel 20. The vending machine interface according to the present embodiment includes at least the front panel 10, the product selection panel 20 and the piezoelectric element 100. The foregoing embodiment uses physical samples to show the product. Alternatively, the product sample can be an electronic image shown on a display.

Each of the piezoelectric elements 100 is attached to the product selection panel 20 at a position corresponding to a respective one of the product samples 55. The name and/or price of each product sample 55 can be displayed on the product selection panel 20 (preferably at a location corresponding to the associated product sample). In order to select a given product to be purchased, the user pushes a portion of the front panel 10 where the product name and/or the price of the product is shown. In the preferred embodiment the user pushes the front panel 10 at the location of the product selection panel 20 located on a lower side of a product sample 55 to be purchased. This causes the front panel 10, and with it the product selection panel 20, to bend. The product selection panel 20 bends with a predetermined position pushed by the user as a center. Accordingly, a piezoelectric element 100 attached to the predetermined position bends and generates an electric charge.

Figure 3:
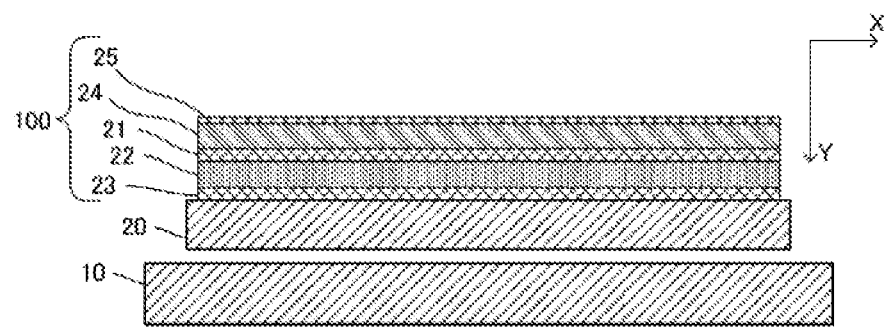
FIG. 3 is a cross-sectional view showing a structure of a piezoelectric element.

FIG. 3 is a cross-sectional view showing a structure of the piezoelectric element 100. The piezoelectric element 100 includes a first electrode 21, a flexible printed circuit board (hereinafter, referred to as an FPC 22), a second electrode 23, a piezoelectric film 24, and a conductive thin film member 25.

The first electrode 21 and the second electrode 23 are formed on opposite principal surfaces of the FPC 22, respectively, in advance. The second electrode 23 is attached to the product selection panel 20 using an adhesive or the like. The second electrode 23, while not essential, is preferably provided and functions as a shield conductor.

The FPC 22 is preferably formed of an insulating base material having flexibility such as polyimide, polyethylene terephthalate (PET), or liquid crystal polymer. The second electrode 23 is formed on a lower surface side (the Y direction side) of the FPC 22.

The first electrode 21 is formed on an upper surface side (the −Y direction side) of the FPC 22. The first electrode 21 functions as a signal electrode for detecting an electric charge generated in the piezoelectric film 24. The first electrode 21 is formed extending in a longitudinal direction (an X direction) of the FPC 22.

The piezoelectric film 24 is attached to an upper (as viewed in FIG. 3) surface of the first electrode 21. Further, the conductive thin film member 25 is attached to an upper surface of the piezoelectric film 24. As the conductive thin film member 25, for example, a conductive nonwoven fabric with an adhesive formed thereon or a copper foil impregnated with a resin with an adhesive formed thereon is preferably used. This configuration allows the conductive thin film member 25 to function as a ground conductor. Note that the conductive thin film member 25 is preferably lower in rigidity than the first and second electrodes 21 and 23 so as not to hinder deformation of the piezoelectric film. The conductive thin film member 25 may be formed of a material identical to a material of which the first electrode 21 and the second electrode 23 is formed. In this configuration, the conductive thin film member 25 is preferably thinner than the first and second electrodes 21 and 23.

The piezoelectric film 24 is preferably formed of a piezoelectric material that is expanded and contracted to generate an electric charge in its opposed principal surfaces. The piezoelectric film 24 is formed of, for example, polyvinylidene difluoride (PVDF) or a chiral polymer. When the chiral polymer is used, uniaxially stretched polylactic acid (PLA), more specifically, poly-L-lactic acid (PLLA) is more preferably used. The uniaxial stretching direction of the polylactic acid is a direction of approximately 45° with respect to a longitudinal direction (the X direction) or a transverse direction (the Y direction) of the piezoelectric film. "Approximately 45°" refers to, for example, a range with a margin of ±10°. Note that a range slightly exceeding ±10° is also included in "approximately 45°". Further, in a plane of the front panel 10, piezoelectric films having different stretching directions may be disposed at a portion that is prone to deformation and a portion that is less prone to deformation. For example, a piezoelectric film with a uniaxial stretching direction of 45° is disposed at the portion that is less prone to deformation, and a piezoelectric film with a uniaxial stretching direction that slightly deviates from 45° is disposed at the portion that is prone to deformation. This configuration allows an in-plane distribution of pushing sensitivity of the front panel 10 to be made uniform (to reduce a difference in sensitivity). For example, the closer to a center of the front panel 10 is, the more the deformation may occur, and the closer to a periphery of the front panel 10 is, the less the deformation may occur. In this case, the uniaxial stretching direction of a piezoelectric film attached to the vicinity of the periphery is 45°, and the closer to the center is, the more the uniaxial stretching direction of a piezoelectric film deviates from 45°.

The chiral polymer has a spiral principal chain and becomes piezoelectric when being uniaxially stretched to cause its molecules to be aligned. The chiral polymer becomes piezoelectric through the molecular alignment processing such as the stretching, which eliminates the need for polling processing to which other polymers such as PVDF or piezoelectric ceramics are subjected. In particular, the polylactic acid is not pyroelectric; thus, even when the user pushes the front panel 10 and then heat from a finger of the user or the like is transmitted, the amount of electric charge detected does not vary. Further, a piezoelectric constant of the uniaxially stretched PLLA belongs to a very high class among piezoelectric constants of polymers. For example, a high value of 10 to 20 pC/N can be obtained for a piezoelectric strain constant d14 of the PLLA by adjusting conditions such as a stretching condition, a heat treatment condition, and blending of additives. Furthermore, the piezoelectric constant of PLLA does not fluctuate over time and is extremely stable. The piezoelectric film 24 using the chiral polymer does not react to just a touch on the front panel 10 the user makes with his or her finger. Therefore, the vending machine 1 has no possibility of erroneously detecting that a product has been selected, despite the user not pushing the front panel 10.

Note that a stretch ratio of the piezoelectric film is preferably about three to eight times. Heat treatment performed on polylactic acid after stretching the polylactic acid accelerates crystallization of an extended chain crystal of the polylactic acid and then improves the piezoelectric constant. Note that, in a case of biaxial stretching, making stretch ratios of the respective axes different from each other allows an effect similar to the effect resulting from uniaxial stretching to be obtained. For example, when, with a certain direction set as an X axis, stretching is performed in an X-axis direction at a stretch ratio of eight times and in a Y-axis direction orthogonal to the X axis at a stretch ratio of two times, as for the piezoelectric constant, an effect equivalent to an effect resulting from uniaxial stretching in the X-axis direction at a stretch ratio of about four times can be obtained. A piezoelectric film simply uniaxially stretched is prone to split along a stretching axis direction; thus, performing such biaxial stretching increases strength to some extent.

In the present embodiment (and as shown in FIG. 3), the product selection panel 20 faces the front panel 10 with one of its principal surfaces lying parallel to and facing one of the principal surfaces of the front panel 10. It spaced from and not fixed to the front panel 10. Alternatively, it may be in contact with and fixed to the front panel 10. Other configurations can also be used.

Figure 4A:
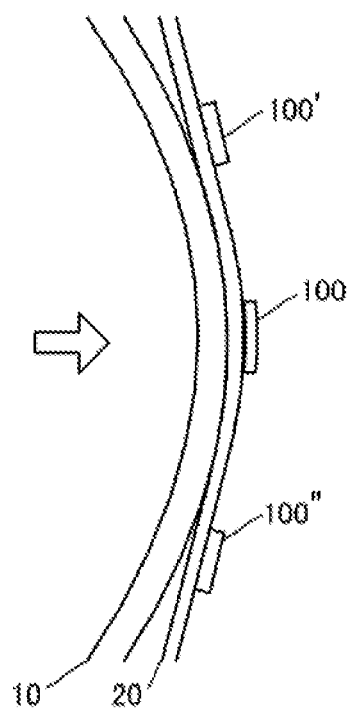
FIG. 4(A) is a diagram showing bending of a front panel and bending of a product selection panel in the present embodiment.
Figure 4B:
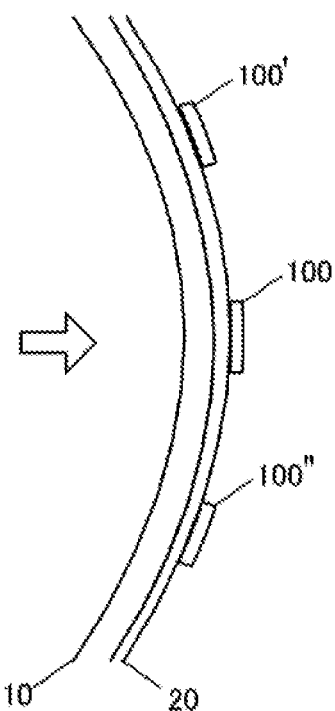
FIG. 4(B) is a diagram showing bending in a case where the front panel and the product selection panel are fixed to each other.

FIG. 4(A) is a diagram showing bending of the front panel and the product selection panel in the present embodiment wherein the front panel is spaced from and not fixed to the product selection panel. FIG. 4(B) is a diagram showing bending of the front panel and the product selection panel in an alternative embodiment wherein the front panel and the product selection panel are in contact and fixed to each other. Note that the bending shown in FIGS. 4(A) and 4(B) are exaggerated for purposes of ease of explanation.

FIG. 4(B) shows an embodiment where the front panel 10 is in contact with, and coupled to, the product selection panel 20. As explained below, this arrangement has a potential problem.

When a user pushes a selection position of the front panel (i.e., the user pushes the front panel in the area pointed to by the hollow arrow in FIG. 4(B)), the front panel, and with it the area of the product selection panel surrounding the pushed position, bends significantly. That is, the entire portion of the product selection panel shown in FIG. 4(B), is significantly bent. This can be problematic since the piezoelectric elements 100' and 100" located on either side of the piezoelectric element 100 (the piezoelectric element corresponding to the product the user wants to purchase) will bend significantly and each of the three piezoelectric elements 100, 100' and 100" will generate a significant electric charge. This could result in a misidentification of the product the user wants to purchase.

The preferred embodiment avoids this problem by spacing the front panel 10 from the product selection panel as shown in FIG. 4(A). Because the product selection panel 20 is not fixed to the front panel 10, only the portion of the product selection panel 20 corresponding to the product to be purchased will be significantly bent when the user presses the front panel 10 at desired location (i.e., the location pointed to by the hollow arrow in FIG. 4(A)). Since the surrounding area of the product selection panel 20 do not bend significantly, the piezoelectric elements 100' and 100" do not generate any significant electric charge and a misidentification of the product to be purchased is avoided.

Figure 5:
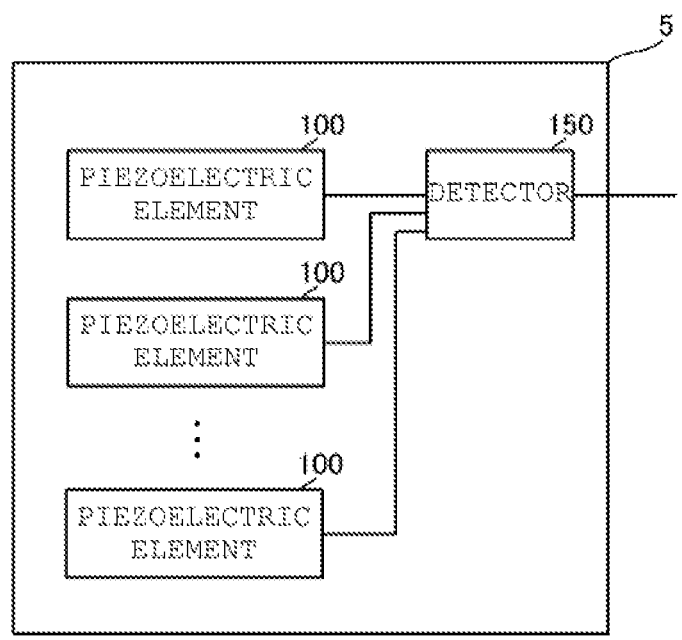
FIG. 5 is a block diagram of a pressure sensor.

FIG. 5 is a block diagram of a pressure sensor for use in the vending machine interface. The pressure sensor 5 includes a plurality of the piezoelectric elements 100 and a detector 150. The detector 150 is connected to each of the piezoelectric elements 100 and detects an electric charge generated in each of them. It uses this information to detect a pushing operation on the front panel 10.

More particularly, since each location on the front panel corresponds to the location of a particular product to be purchased and each piezoelectric element is associated with a respective location of a particular product to be purchased, the detector 150 can determine what product has been selected by determining which piezoelectric element 100 has generated an electric charge (typically an electric charge which is greater than a predetermined value). The pressure sensor 5 then generates identification information related to the product selected and sends that information to a controller (not shown) of the vending machine 1. To this end, the pressure sensor 5 includes a memory (not shown) which stores a table indicating an association between each piezoelectric element 100 and the identification information on the product corresponding to that piezoelectric element in the memory.

The foregoing configuration allows the vending machine interface of the present embodiment to detect a selection operation for each product with neither a through hole provided to the front panel 10 nor a selection button disposed on the front panel 10. The vending machine interface of the present embodiment uses the piezoelectric element to detect the pushing operation made by the user; thus, unlike a capacitive touch panel, the vending machine interface does not react to just a touch of a finger. The vending machine interface of the present embodiment can determine that a product has been selected only when the user firmly performs the pushing operation, which prevents an erroneous operation and an erroneous determination. Further, the vending machine interface of the present embodiment has a configuration where product samples are arranged and the pushing operation made by the user is detected with the piezoelectric element, which makes the vending machine interface greater in light resistance than a liquid crystal display device that displays product samples on a display and thus allows vending machines to be installed even outdoors.

Figure 6A:
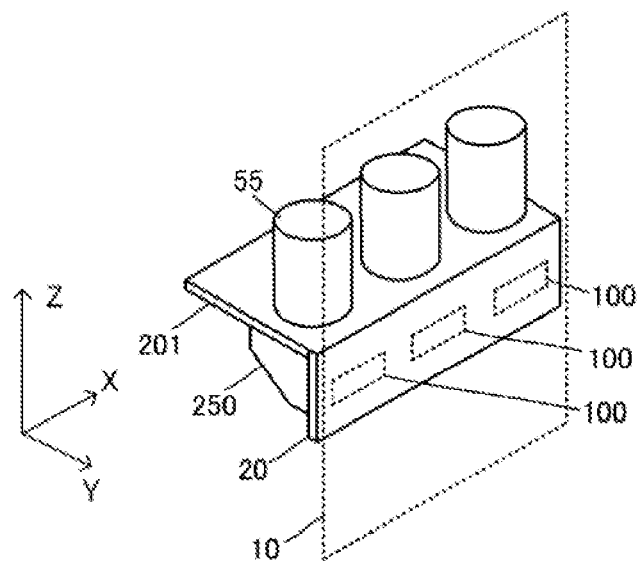
FIG. 6(A) is a partially-transparent perspective view of a vending machine according to a modification 1.
Figure 6B:
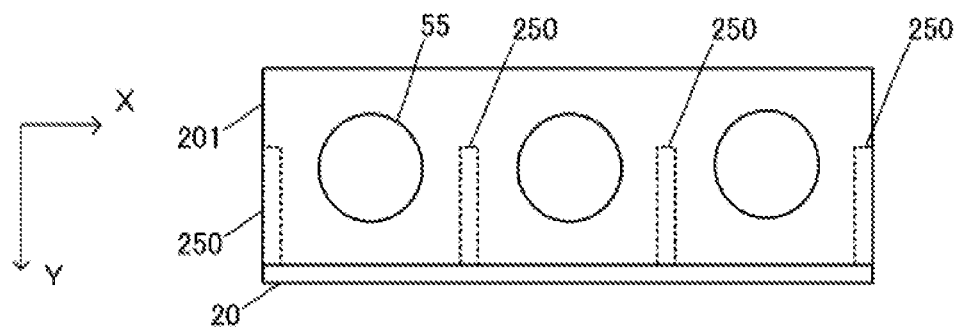
FIG. 6(B) is an X-Y plan view of the vending machine.

Next, FIG. 6(A) is a partially-transparent perspective view of a vending machine according to a first modification of the present invention. FIG. 6(B) is an X-Y plan view of the vending machine. In FIG. 6(A), components identical to the components in FIG. 2 are given the same reference numerals as are given to the components in FIG. 2, and description of the components will be omitted.

The vending machine interface of the modification 1 includes a series of partition plates 250. Each of the partition plates 250 is connected to a back of the product selection panel 20 and are disposed perpendicular to the principal surfaces of the product selection panel 20, such that each of the partition plates 250 has principal surfaces extending parallel to the YZ plane. The partition plate 250 is further connected to the flat plate 201. While preferred, the connection to the flat plate 201 is not essential. The partition plate 250 is provided between adjacent product samples and, therefore, between the adjacent piezoelectric elements 100.

The partition plate 250 prevents, or at least suppresses, the product selection panel 20 from being deformed. Accordingly, when the predetermined position in the front panel 10 is pushed, bending of the product selection panel 20 at positions other than the predetermined position is suppressed. Therefore, the vending machine interface of the modification 1 can further suppress electric charges generated in any of the piezoelectric elements 100 other than the piezoelectric element 100 corresponding to the product selected.

Figure 7A:
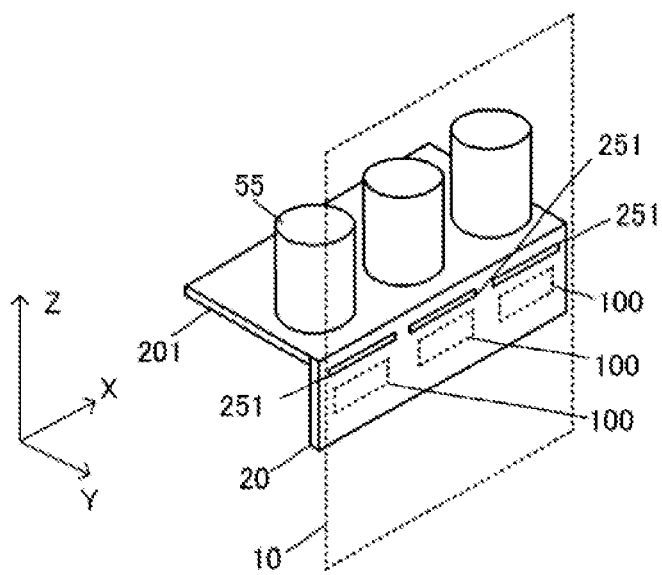
FIG. 7(A) is a partially-transparent perspective view of a vending machine according to a modification 2.
Figure 7B:
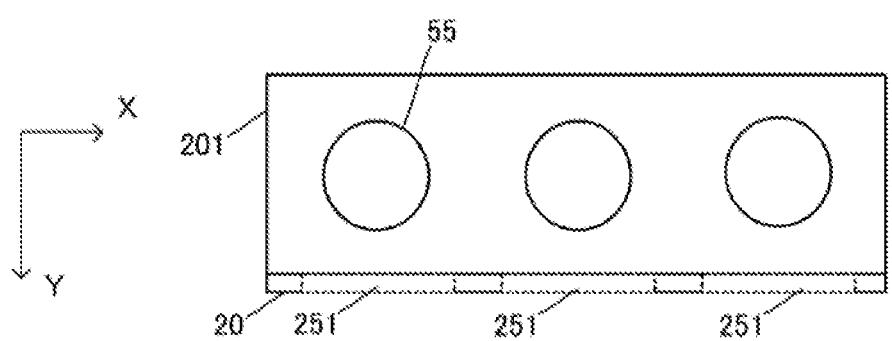
FIG. 7(B) is an X-Y plane view of the vending machine.

Next, FIG. 7(A) is a partially-transparent perspective view of a vending machine according to a modification 2. FIG. 7(B) is an X-Y plan view of the vending machine. In FIG. 7(A), components identical to the components in FIG. 2 are given the same reference numerals as are given to the components in FIG. 2, and description of the components will be omitted.

The vending machine interface of the modification 2 includes a plurality of slits 251, each of which is formed at a position corresponding to a respective one of the product samples in the product selection panel 20. In the preferred embodiment, each of the plurality of slits 251 extend in a direction parallel to length direction of its associated piezoelectric element 100 and extends in a direction parallel to the principal surfaces of the product selection panel 20. Each of the slits 251 preferably has a rectangular shape in front view and has long sides extending in the X direction. In an alternative embodiment, a respective slit 251 is provided between each pair of adjacent product samples. This configuration makes the number of slits smaller, which facilitates manufacture.

Note that the slit 251 may penetrate opposite principal surfaces of the product selection panel 20 or may be formed as a groove in one of the principal surfaces. In either case, the slit or groove serves to make the portion of the product selection plate located below the slit or groove more flexible than other portions of the product selection plate. As a result, when a pressing force is applied to the front panel 10 at a location corresponding to one of the piezoelectric sensors 100, the portion of the product selection plate where the piezoelectric sensor is located will bend relatively freely but the bending force will not easily be transmitted to other locations on the product selection panel (and therefore will not be easily transmitted to other piezoelectric sensors 100).

The flexibility of the portion of the product selection panel corresponding to the slit or groove may be adjusted by adjusting the area and/or depth of the slit or groove. For example, since a position close to the position where the front panel 10 or the product selection panel is fixed is less prone to deformation, the area of the slit or groove may be increased, and since a position distant from the position is prone to deformation, the area of the slit or groove may be reduced.

Each of the slits 251 partially frees the product selection plate 20 from its connection with the flat plate 201. Therefore, when the predetermined position in the front panel 10 is pushed, a portion of the product selection panel 20 corresponding to the predetermined position bends more than surrounding portions of the product selection panel. Accordingly, the vending machine interface of the modification 2 allows the electric charge generated in the piezoelectric element 100 disposed at the predetermined position to increase.

Figure 8A:
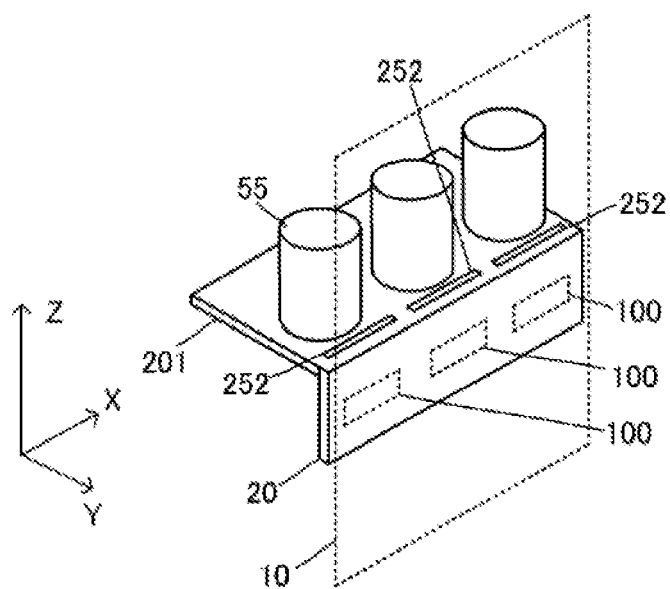
FIG. 8(A) is a partially-transparent perspective view of a vending machine according to a modification 3.
Figure 8B:
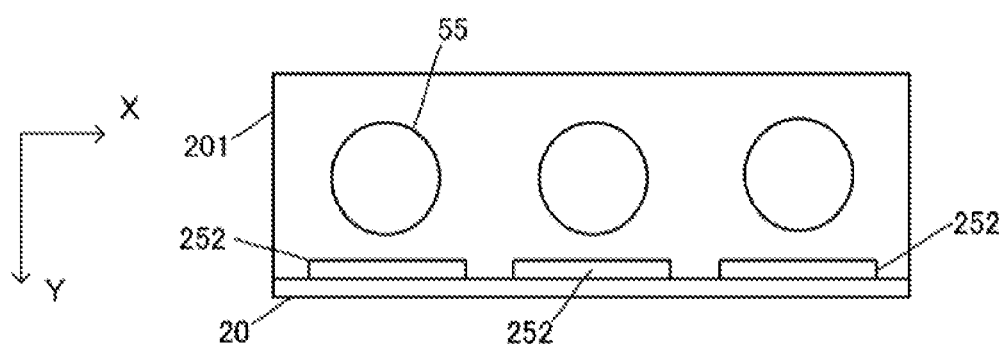
FIG. 8(B) is an X-Y plan view of the vending machine.

FIG. 8(A) is a partially-transparent perspective view of a vending machine according to a modification 3. FIG. 8(B) is an X-Y plan view of the vending machine. In FIGS. 8(A) and 8(B), components identical to the components in FIGS. 7(A) and 7(B) are given the same reference numerals as are given to the components in FIGS. 7(A) and 7(B), and description of the components will be omitted.

Like the embodiment of FIGS. 7(A) and 7(B), the vending machine interface of the modification 3 includes a plurality of slits 252. However, these slits/grooves are formed in the flat plate 201 rather than in the product selection panel 20. Each of the slits 252 extend parallel to the length of the piezoelectric element 100 and in a direction parallel to the principal surfaces of the product selection panel 20. Each of the slits 252 has a rectangular shape in front view and has long sides extending in the X direction.

The presence of the slits 252 causes the product selection panel 20 to be partially free from connection with the flat plate 201. Therefore, when the predetermined position in the front panel 10 is pushed, a portion of the product selection panel 20 corresponding to the predetermined position bends more easily than surrounding portions of the product selection panel 20. Therefore, the vending machine interface of the modification 3 similarly allows the electric charge generated in the piezoelectric element 100 disposed at the predetermined position to increase.

Figure 9A:
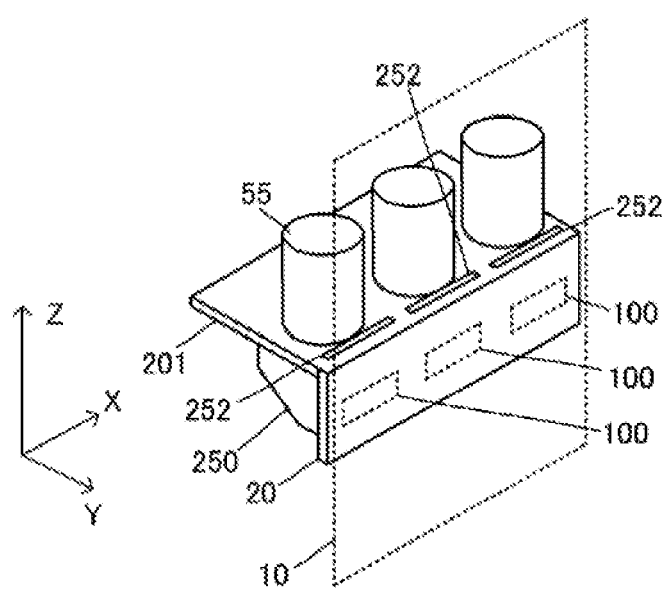
FIG. 9(A) is a partially-transparent perspective view of a vending machine according to a modification 4.
Figure 9B:
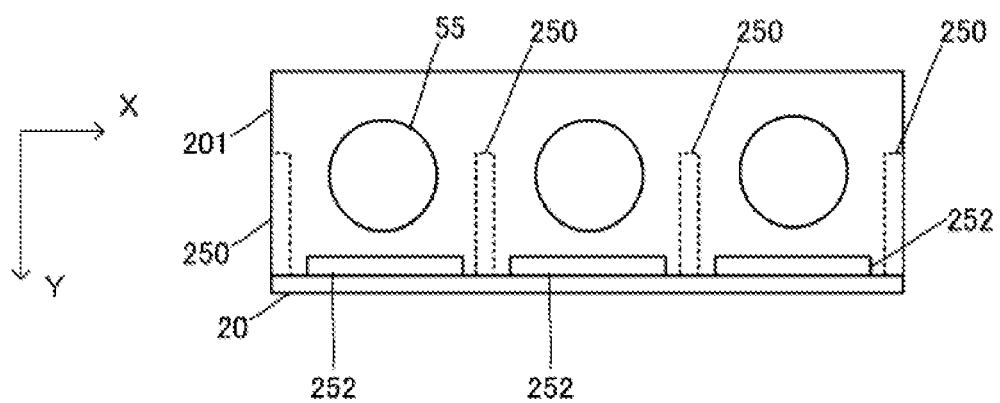
FIG. 9(B) is an X-Y plan view of the vending machine.

Next, FIG. 9(A) is a partially-transparent perspective view of a vending machine according to a modification 4. FIG. 9(B) is an X-Y plan view of the vending machine. In FIGS. 9(A) and 9(B), components identical to the components in FIGS. 8(A) and 8(B) are given the same reference numerals as are given to the components in FIGS. 8(A) and 8(B), and description of the components will be omitted.

The vending machine interface of the modification 4 includes a plurality of partition plates 250 in addition to the components shown in FIGS. 8(A) and 8(B). Therefore, when, with the product selection panel 20 partially free from connection with the flat plate 201, the predetermined position in the front panel 10 is pushed, bending of the product selection panel 20 at positions other than the predetermined position is suppressed.

Note that, in addition to the slits 251 shown in FIGS. 7(A) and 7(B), the vending machine interface may further include the partition plates 250.

Figure 10A:
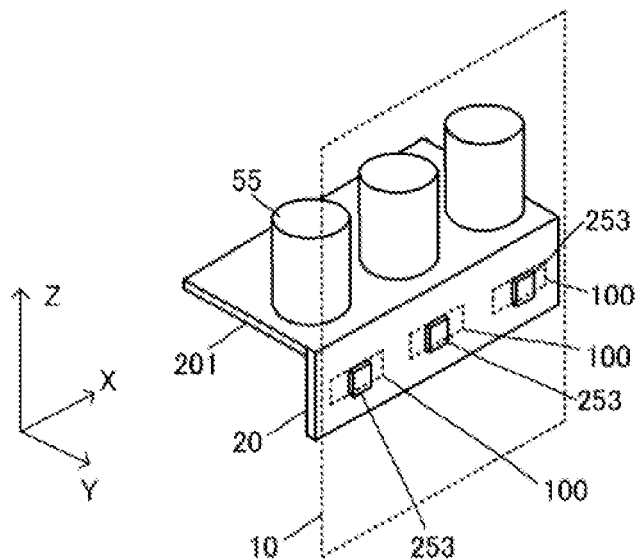
FIG. 10(A) is a partially-transparent perspective view of a vending machine according to a modification 5.
Figure 10B:
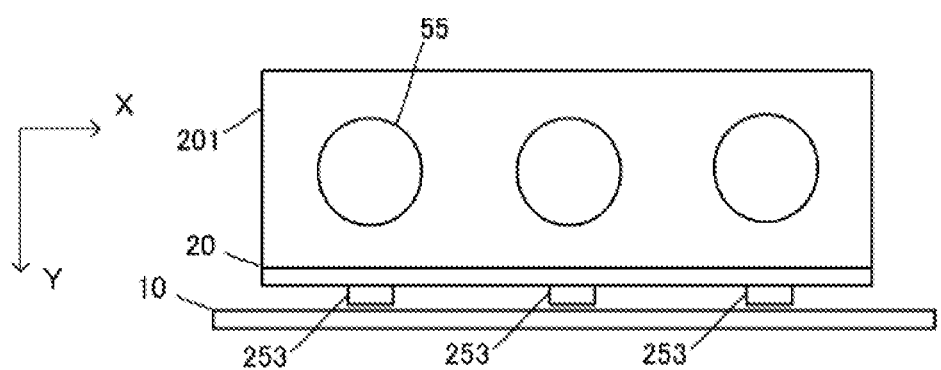
FIG. 10(B) is an X-Y plan view of the vending machine.

Next, FIG. 10(A) is a partially-transparent perspective view of a vending machine according to a modification 5. FIG. 10(B) is an X-Y plan view of the vending machine. In FIGS. 10(A) and 10(B), components identical to the components in FIG. 2 are given the same reference numerals as are given to the components in FIG. 2, and description of the components will be omitted.

The vending machine interface according to the modification 5 includes a plurality of protrusions 253 provided between the front panel 10 and the product selection panel 20. In this example, the protrusions 253 are formed on the product selection panel 20. Alternatively, they may be formed on the front panel 10.

In the vending machine interface according to the modification 5, when the front panel 10 is pushed at a location corresponding to a particular protrusion 253, the protrusion 253 pushes against a corresponding portion of the product selection panel 20. This has the effect of concentrating the pushing force at a relatively narrow position corresponding to one of the piezoelectric sensors 100 compared to the arrangement where the front panel 10 directly pushes the product selection panel 20. Accordingly, the position in the product selection panel 20 at which the piezoelectric element 100 is disposed bends significantly, and the other positions do not. This allows a product to be more accurately selected.

Figure 11A:
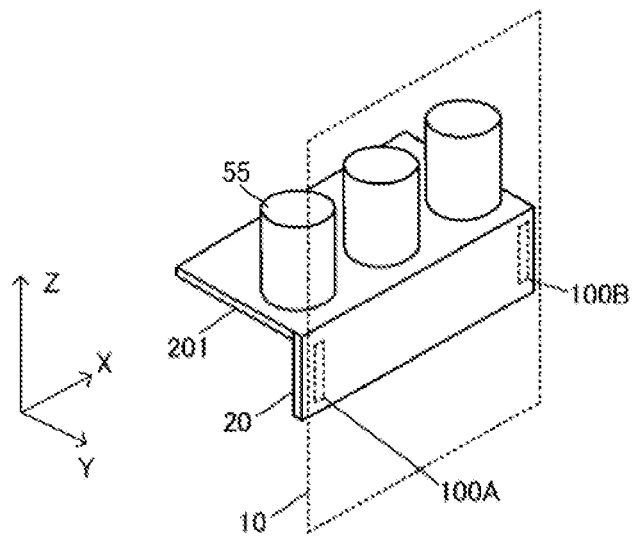
FIGS. 11(A) and 11(B) are partially-transparent perspective views of a vending machine according to a modification 6.

FIG. 11(A) is a partially-transparent perspective view of a vending machine according to a modification 6. Components identical to the components in FIG. 2 are given the same reference numerals as are given to the components in FIG. 2, and description of the components will be omitted.

The vending machine interface according to the modification 6 includes two piezoelectric elements (a piezoelectric element 100A and a piezoelectric element 100B) arranged at opposite the ends (both the ends in the X direction) of the product selection panel 20. The detector 150 calculates a ratio between electric charges generated in the piezoelectric elements 100A and 100B to estimate a pushed position (a selected product).

For example, when the user pushes a left side of the front panel 10, a relatively large electric charge is generated in the piezoelectric element 100A disposed on the left side, and a relatively small electric charge is generated (or no charge is generated) in the piezoelectric element 100B disposed on a right side. When the user pushes a portion of the front panel 10 close to the center between the left and right sides, the same degree of electric charge is generated in the piezoelectric element 100A and the piezoelectric element 100B. When the user pushes the right side of the front panel 10, a relatively large electric charge is generated in the piezoelectric element 100B, and a relatively small electric charge is generated (or no electric charge is generated) in the piezoelectric element 100A.

This configuration allows the detector 150 to calculate a ratio between electric charges generated in the piezoelectric element 100A and the piezoelectric element 100B to estimate a pushed position (a selected product).

Figure 11B:
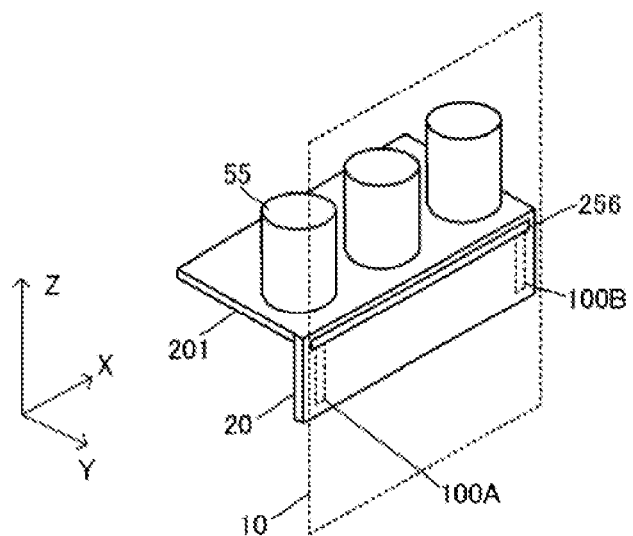

Note that, as shown in FIG. 11(B), even when the piezoelectric element 100A and the piezoelectric element 100B are disposed at opposite ends, providing a slit 256 in the product selection panel 20 allows the product selection panel 20 to bend significantly. In the example of FIG. 11(B), one slit 256 which extends in a direction parallel to the principal surfaces of the product selection panel 20 is formed in the product selection panel. The slit 256 preferably has a rectangular shape in front view and has long sides extending in the X direction. Alternatively, the slit may be formed in the flat plate 201.

Various alternatives may be used. For example, a slit may be provided in both the product selection panel and the flat plate or may extend across both the product selection panel and the flat plate. Furthermore, a slit may be provided to the product selection panel only at a position corresponding to a certain product sample, and the other slits may be provided to the flat plate.

While it is preferred to use a piezoelectric element to detect the pushing force applied to the front panel 10, a strain gauge or the like that causes its resistance value to change when a pushing force is applied can be used. Since the strain gauge utilizes the change in resistance, a detected value does not largely fluctuate, regardless of a pushing speed (whether the user pushes fast or slowly) compared to the piezoelectric element. However, the strain gauge consumes more power than the piezoelectric element. Further, it is difficult for the strain gauge to distinguish, when the front panel 10 is deformed, whether the deformation occurs due to pushing made by the user or other causes. The front panel 10 may be slightly deformed when being installed in a place (for example, outdoors) prone to the influence of outside air. Therefore, for a device installed outdoors like a vending machine, a piezoelectric element is suitable.

DESCRIPTION OF REFERENCE SYMBOLS

1: vending machine
5: pressure sensor
10: front panel
15: bill acceptor
17: coin acceptor
20: product selection panel
21: first electrode
22: FPC
23: second electrode
24: piezoelectric film
25: conductive thin film member
30: change dispenser
40: product dispenser
50: Housing
55: product sample
100, 100A, 100B: piezoelectric element
150: detector
201: flat plate
250: partition plate
251, 252, 256: Slit
253: protrusion

The invention claimed is:

1. A vending machine interface comprising:
a planar front panel having a transparent section that bends in a direction perpendicular to its plane in response to a pressing force applied by a user;
a product selection panel facing the transparent section of the front panel and being viewable through the transparent section of the front panel, the product selection panel having indicators which divide the product selection panel into a plurality of product selection areas, each of the product selection areas corresponding to a respective product to be vended; and
a sensor configured to detect when the transparent section of the front panel has been bent at a location corresponding to any one of the product selection areas.

2. The vending machine interface according to claim 1, wherein the sensor includes a plurality of individual pressure sensors, each of the individual pressure sensors being associated with a respective one of the product selection areas, and a detector coupled to the individual pressure sensors, the detector determining to which of the product selection areas a bending force of a predetermined minimum value is being applied.

3. The vending machine interface according to claim 2, wherein each of the individual pressure sensors is a piezoelectric sensor.

4. The vending machine interface according to claim 2, wherein each of the individual pressure sensors is a strain gauge.

5. The vending machine interface according to claim 1, wherein:
the sensor is attached to the product selection panel; and
the product selection panel is spaced from the front panel before a pressing force is applied to the transparent section of the front panel and comes into contact with the product selection panel when a pressing force of a sufficient value to applied to the transparent section of the front panel at a location corresponding to one of the product selection areas.

6. The vending machine interface according to claim 5, wherein each of the product selection areas is associated with a respective set of one or more slits and/or grooves formed in the product selection panel to cause a bending force applied to the product selection area to be concentrated in the product selection area.

7. The vending machine interface according to claim 5, further comprising a plurality of protrusions, each of the protrusions being associated with a respective one of the product selection areas and being located on either its associated product selection area or a portion of the transparent section of the front panel facing its associated product selection area, each of the protrusions extending into a space which exists between the product selection panel and the transparent section of the front panel before the pressing force of the sufficient value is applied to the transparent section of the front panel.

8. The vending machine interface according to claim 1, wherein the product selection panel is spaced from the transparent section of the planar front panel.

9. The vending machine interface according to claim 1, wherein the indicators are samples of the products to be vended.

10. The vending machine interface according to claim 1, wherein the indicators are representations of the products to be vended.

11. The vending machine interface according to claim 1, wherein each of the locations on the transparent section of the front panel which corresponds to a respective one of the product selection areas is located directly in front of its respective product selection area.

12. The vending machine interface according to claim 1, wherein the entirety of the front panel is transparent.

13. The vending machine interface according to claim 1, wherein the location corresponding to any one of the product selection areas is located directly in front of its corresponding product selection area.

14. The vending machine interface according to claim 1, wherein the entire front panel is transparent.

15. A vending machine comprising:
a storage unit for storing products to be vended;
a dispenser for dispensing products from the storage unit;
a planar front panel having a transparent section that bends in a direction perpendicular to its plane in response to a pressing force applied by a user;
a product selection panel located behind the planar front panel and being viewable through the transparent section of the front panel, the product selection panel having a first surface for holding a plurality of product samples and a second surface facing the transparent section of the front panel, the first surface being divided into a plurality of product placement locations, each product placement location corresponding to a respect one of the product samples, the second surface being divided into a plurality of product selection areas, each product selection area corresponding to a respective one of the product; and
a plurality of pressure sensors, each pressure sensor being attached to and associated with a respective product selection areas of the product selection panel, each sensor being configured to detect bending of the transparent section of the front panel at a location corresponding to its associated one of the product selection areas.

16. The vending machine according to claim 15, wherein each of the pressure sensors is a piezoelectric element.

17. The vending machine according to claim 15, wherein each of the pressure sensors is a strain gauge.

18. The vending machine according to claim 15, wherein the second surface of the product selection panel is spaced from the transparent portion of the front panel before a pressing force is applied to the transparent portion of the front panel and comes into contact with the product selection panel when a pressing force of a sufficient value to applied to the transparent portion of the front panel.

19. The vending machine according to claim 18, further comprising a plurality of protrusions, each of the protrusions being associated with a respective one of the product selection areas and being located on either its associated product selection area or a portion of the transparent section of the front panel facing its associated product selection area, each of the protrusions extending into a space between the product selection panel and the transparent section of the front panel.

20. The vending machine according to claim 15, wherein each of the product selection areas is associated with a respective set of one or more slits and/or grooves formed in the product selection panel to cause a bending force applied to the product selection area to be concentrated in the product selection area.

21. The vending machine according to claim 15, further comprising a plurality of partition plates, each of the partition plates being connected to a back surface of the product selection panel at a respective location between a respective pair of product sample areas.

22. The vending machine according to claim 15, wherein the first and second surfaces of the product selection panel are perpendicular to one another and the vending machine further comprises a plurality of slits and/or grooves formed in the product selection panel, each of the slits and/or grooves being associated with a respective one of the product selection areas and being located in or adjacent to its associated product selection area, each of the slits and/or grooves extending in a direction parallel to the first surface.

23. The vending machine according to claim 15, wherein each of the product selection panel is spaced from the transparent section of the planar front panel.

24. The vending machine according to claim 15, wherein the indicators are samples of the products to be vended.

25. The vending machine according to claim 15, wherein each of the locations on the transparent section of the front panel which corresponds to a respective one of the product selection areas is located directly in front of its respective product selection area.

26. The vending machine according to claim 15, wherein the entirety of the front panel is transparent.

27. The vending machine according to claim 15, wherein the location corresponding to any one of the product selection areas is located directly in front of its corresponding product selection area.

28. A vending machine, comprising:
a storage unit for storing products to be vended;
a dispenser for dispensing products from the storage unit; and
the vending machine interface according to claim 1.

* * * * *